(12) United States Patent
Dulay et al.

(10) Patent No.: US 7,186,574 B2
(45) Date of Patent: Mar. 6, 2007

(54) CMP PROCESS METROLOGY TEST STRUCTURES

(75) Inventors: Sukhbir Singh Dulay, San Jose, CA (US); Thomas L. Leong, San Jose, CA (US); John Jaekoyun Yang, Newark, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/956,452

(22) Filed: Sep. 30, 2004

(65) Prior Publication Data

US 2006/0068511 A1    Mar. 30, 2006

(51) Int. Cl.
    *H01L 21/66* (2006.01)
    *H01L 21/461* (2006.01)
    *H01L 21/302* (2006.01)
    *H01L 21/4763* (2006.01)
    *G01R 31/26* (2006.01)

(52) U.S. Cl. .................. 438/14; 438/692; 438/633; 257/E21.237; 257/E21.583

(58) Field of Classification Search .................... 438/3, 438/14, 633, 626, 692; 257/E21.237, E21.58, 257/E21.583, E21.219, E21.224, E21.23
    See application file for complete search history.

(56) References Cited

U.S. PATENT DOCUMENTS

| 5,246,884 A | 9/1993 | Jaso et al. |
| 5,433,651 A | 7/1995 | Lustig et al. |
| 6,344,408 B1 | 2/2002 | Chen et al. |
| 6,702,648 B1 * | 3/2004 | Avanzino et al. ............... 451/6 |
| 6,727,107 B1 | 4/2004 | Dunton et al. |
| 2002/0013058 A1 | 1/2002 | Tang |
| 2004/0038624 A1 | 2/2004 | Weldon et al. |
| 2004/0117054 A1 | 6/2004 | Gotkis et al. |
| 2004/0117146 A1 | 6/2004 | Liu et al. |
| 2004/0147048 A1 | 7/2004 | Jakatdar et al. |

* cited by examiner

*Primary Examiner*—Walter Lindsay, Jr.
(74) *Attorney, Agent, or Firm*—G. Marlin Knight

(57) ABSTRACT

A method for forming metrology structures for a CMP process is described. A trench edge is formed in a base material or stack of materials which are preferably deposited as part of the process of fabricating the production structures on the wafer. A covering film of a second material with preferably with contrasting SEM properties is deposited over the trench edge in the base material. During CMP the covering film is preferentially worn away at the edge revealing the base material. The width of the base material which has been revealed is a measure of the progress of the CMP. Since the base material and the covering material are preferably selected to have contrasting images in an SEM, a CD-SEM can be used to precisely measure the CMP progress.

8 Claims, 3 Drawing Sheets

CMP PROCESS METROLOGY TEST STRUCTURES

FIELD OF THE INVENTION

The invention relates to the methods, materials and structures used in thin film device fabrication in combination with chemical-mechanical polishing (CMP) processes to provide indicators for the CMP progress and more particularly, the invention relates methods, materials and structures used in combination with CMP processes during the fabrication of magnetic sensors.

BACKGROUND OF THE INVENTION

The read and write head portions of the magnetic transducer for use in a typical prior art magnetic disk recording system are built-up in layers using thin film processing techniques. Typically the read head is formed first, but the write head can also be fabricated first. The conventional write head is inductive and the read sensor is magnetoresistive. In the typical process of fabricating thin film magnetic heads, a large number of heads are formed simultaneously on a wafer. After the basic structures are formed the wafer is cut into rows or individual devices which are also called sliders.

CMP is used at various stages in the fabrication of thin film magnetic heads for photoresist lift-off and to planarize the wafer. One problem in CMP operations is determining when the polishing process is complete. If the CMP continues longer than necessary, then damage to the components can result. Variations in the thickness of the layers, the slurry composition, the polishing pad condition, the relative speed between the polishing pad and the substrate, and pressure can cause variations in the rate of material removal. These variations cause variations in the time needed to reach the polishing endpoint. Therefore, in critical phases of the fabrication process the polishing endpoint cannot be determined merely as a function of polishing time. One way to determine the polishing progress is to remove the substrate and examine it at a metrology station. If the desired specifications are not met, the substrate is reloaded into the CMP apparatus for further processing. The state of the CMP progress may not be easy to observe or measure for some structures. This is particularly true of the CMP which is used as a photoresist lift-off aid during the fabrication of some type of magnetic sensors. Some methods for in-situ polishing endpoint detection monitor a parameter associated with the substrate surface, and detect an endpoint when the parameter abruptly changes. For example, if a dielectric layer is being polished to expose an underlying metal layer, the coefficient of friction and the reflectivity of the substrate will change abruptly when the metal layer is exposed. In the magnetic sensor case, this approach is not applicable.

The magnetic sensor for a magnetic head is deposited and initially patterned in a phase of the process which will be called "K3". The K3 CMP process has been difficult to monitor due to the lack of necessary topography needed to measure the carbon recession which occurs in the CMP process. The carbon recession measurement is made later in the process at the "K5" stage where the hard-bias structures are formed at the sides of the sensor and the existence of surface topography makes measurement easier. Measurement at a subsequent phase is too late to use during the K3 CMP.

The magnetic sensor used in disk and tape drives can be any one of various types including tunnel-junction (TMR) and spin valves. In TMR and some spin valves designs the current in the sensor flows perpendicular to the film (CPP). The fabrication problems for TMR and CPP spin valves sensors are different than for those where current flows in the plane (CIP) of the film. FIG. 1 illustrates selected components in a TMR head 10 at a selected point during the fabrication process. The section is taken perpendicular the surface of the wafer. The set of layers comprising the sensor layer stack 12 are initially deposited over the entire wafer. A first layer of diamond-like carbon (DLC) 13 is deposited over the sensor layer stack 12. A photoresist mask 14 has been applied and the trench on the right side of the FIG. 1 has been formed. After the trench is formed a layer of alumina 15 is deposited followed by a second layer of DLC 16. The second layer of DLC 16 is typically significantly thicker than the first DLC layer 13. The wafer at the stage shown in FIG. 1 is ready for a chemical-mechanical polishing (CMP) process which is used to lift-off the photoresist 14 and the alumina and DLC films above it.

Scanning Electron Microscopes (SEMs) use an electron beam to image and measure features on a semiconductor wafer at higher resolution than optical microscopes. The electron beam causes secondary electrons and back-scattered electrons to be released from the wafer surface. Some SEMs can analyze the image using software to extract information. CD-SEMs are used in thin film manufacturing to measure the "critical dimension" (CD) of the sub-micron-sized features on a wafer to assure the accuracy of the process. The most advanced CD-SEM systems are fully automated and can process wafers without operator intervention. The system software can automatically detect features on the wafer that out of specification for further review and corrective action by process engineers. The contrast in CD-SEM images results from a variety of factors such as atomic number, density and dielectric constant of the materials.

U.S. Pat. No. 5,433,651 to Lustig, et al. describes in-situ chemical-mechanical polishing monitoring using a reflectance measurement is used to monitor the polishing process.

In published U.S. patent application 2004/0147048 by Jakatdar, Nickhil, et al., the invention includes an embodiment for designing underlying periodic calibration structures of varying line-to-space ratios in one or more underlying layers of a wafer for CMP monitoring. The periodicity of the underlying structure is positioned at an angle relative to the direction of periodicity of the target structure of the wafer.

SUMMARY OF THE INVENTION

A method for forming metrology structures for a CMP process is described. An edge is formed in a base material or stack of materials which are preferably deposited as part of the process of fabricating the production structures on the wafer. A covering film of a second material with preferably with contrasting SEM properties, such as atomic number, is deposited over the trench and edge of the base material. During CMP the covering film is preferentially worn away at the edge revealing the base material. The width of the base material which has been revealed is a measure of the progress of the CMP. Since the base material and the covering material are preferably selected to have contrasting images in an SEM, a CD-SEM can be used to precisely measure the CMP progress. The preferred materials for the metrology structures are selected according to materials used in the production structures on the wafer which are subjected to the CMP process. The metrology structure should be designed to be more sensitive to the CMP action, than the production structures. The shape of this test pattern is selected to be consistently recognizable by the CD-SEM.

A preferred embodiment of a method according to the invention integrates the formation of the metrology test site into a prior art magnetic sensor fabrication process with minimum changes. The sensor layer stack is used for the base material. The trench can be at the same time as the prior art ion-milling process exposes alignment marks under the sensor layer stack. The mask for the milling the alignment marks is patterned to include an opening for a trench for at least one test site. The trench in the sensor layer stack is milled through the opening in the mask at the same time that the sensor layer stack is milled away to expose the alignment marks. The mask is then stripped from the wafer. The first DLC layer deposited over the sensor is also deposited as the covering layer for the metrology test site. The prior art process for initial milling of an edge of the sensor is executed at this point. The mask for this process covers the test site. After the milling and refill steps have been completed for this phase of the sensor definition, chemical-mechanical polishing is used to remove the mask from above the sensor. The effect of the CMP of the test is measured to gauge the progress of the CMP. The width of the edge of the layer stack at the test site exposed through the DLC is measured to determine the progress of the chemical-mechanical polishing. The metals in the sensor layer stack contrast with the DLC in SEM images. The combination of trench edges and the DLC form features on which the DLC will erode more quickly than over the sensor and provide a way to accurately measure the CMP progress as the underlying sensor layer stack is revealed at the metrology test site. A CD-SEM can be used to measure the progression of the CMP on the test sites.

DETAILED DESCRIPTION OF THE INVENTION AND THE PREFERRED EMBODIMENTS

Figure 1:
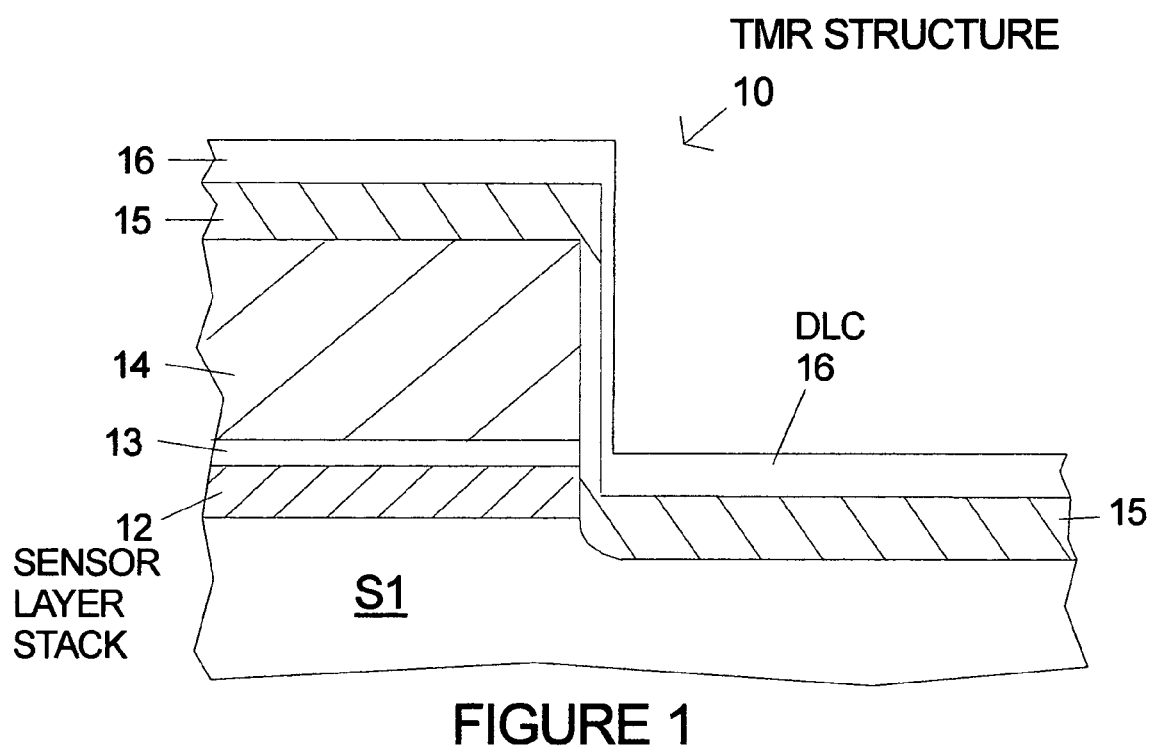
FIG. 1 is an illustration of selected structures of a prior art TMR magnetic head as a selected point in the fabrication process. The section is taken perpendicular to the surface of the wafer and the plane of the thin films. The phase of the process illustrated is defining an initial pad of the sensor layer stack.
Figure 2:
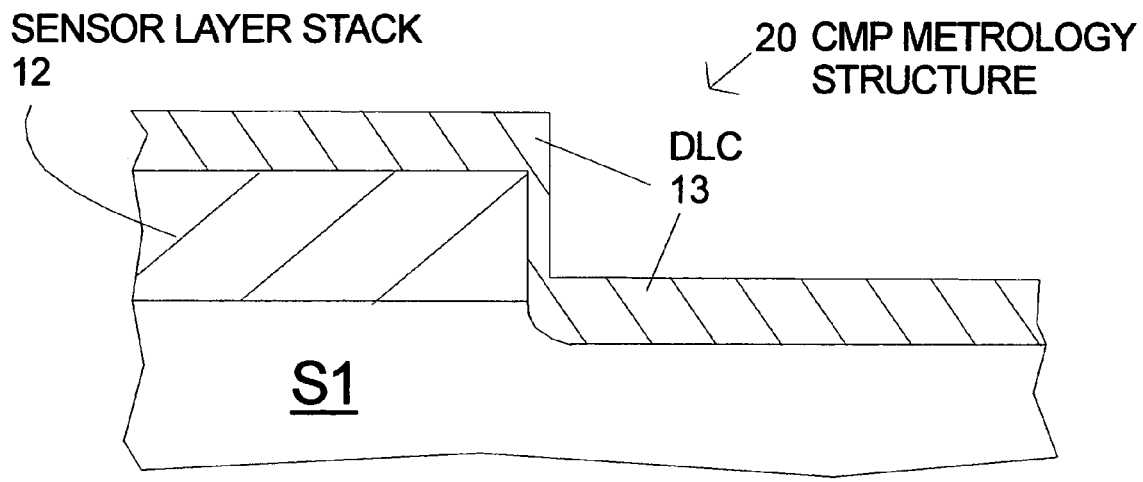
FIG. 2 illustrates a section of a CMP metrology test site according to the invention as initially formed. The section is taken perpendicular to the surface of the wafer.

Thousands of transducers (heads) are produced on each wafer. The CMP metrology test sites described below are located in areas not used for the heads. Any number of the test sites can be used at various positions on the wafer to obtain a representative sample of the CMP action over the wafer. The critical criterion for the metrology test site is that the structure undergoes consistent, measurable changes as the CMP progresses. This criterion is satisfied in the preferred embodiment described below by forming an edge of metallic material which is overlaid with a sufficiently thin layer of DLC. Preferably the rate of change for the metrology test site during CMP is faster than the rate of change in the magnetic sensors structures which cannot be allowed to be damaged by the CMP. The metrology test sites according to the invention can be made separately from the other features on the wafer, but it is preferable to integrate the fabrication of the test sites as seamlessly as possible into the production process to minimize the time and costs associated with use of the test sites. The embodiment of the invention described below integrates the formation of the metrology test site into the fabrication of magnetic sensors as shown in FIG. 1. FIG. 2 illustrates a section of a CMP metrology test site 20 according to the invention formed on the wafer along with the magnetic sensor structure of FIG. 1. The section is taken perpendicular to the surface of the wafer. The heads on the wafer have been processed up the point shown in FIG. 1. The first shield S1 and the sensor layer stack 12 are deposited over the metrology test site at the same time they are deposited for the production devices. After the layer stack for the sensor 12 is deposited, the topography of the metrology test site is created by ion-milling one or more trenches preferably by removing the layer stack 12 and exposing the underlying S1. Since ion-milling is performed as part of prior art process of fabricating magnetic sensors to expose mask alignment marks under the sensor layer stack, this phase of the process can be used to mill the trenches in the metrology test sites simply by including the openings for the test site trenches in the mask. After the trench has been formed, a cover layer of DLC 13 is deposited over the test site. Since a suitable layer of DLC 13 is deposited as part of the prior art process for making magnetic sensors, this layer can be used for the cover layer for the test site. The DLC layer 13 is thinner than the second DLC layer 16 which is shown in the TMR structure in FIG. 1. Since it is the thicker DLC layer 16 which will initially be exposed to the CMP process, it is advantageous to use the thinner DLC layer 13 for the cover layer on the metrology test site. The thickness of the DLC cover layer and the topography of the metrology test site are selected so that DLC recession over the test site is achieved before any damage to the read head occurs.

After the DLC layer 13 is deposited the metrology test site is protected from further milling while the prior art process of initially defining the sensor pattern is executed. As shown in FIG. 1 the photoresist 14 is patterned over the sensor in preparation for milling around the sensor. Photoresist 14 is also deposited over the metrology test sites. The deposition of the alumina 15 and the DLC 16 for the sensor are also deposited over the photoresist 14 over the metrology test sites. A solvent is used to lift-out the bulk of the photoresist 14 which includes the metrology test sites. The solvent is sufficient to remove the photoresist 14, the alumina 15 and the DLC 16 from the metrology test sites. The photoresist over the sensor area is too small to be effectively lifted off by the solvent, so the CMP is executed to ensure lift-off of the photoresist over the sensor. During the CMP the test sites are monitored to gauge the progress of the CMP.

Figure 3:
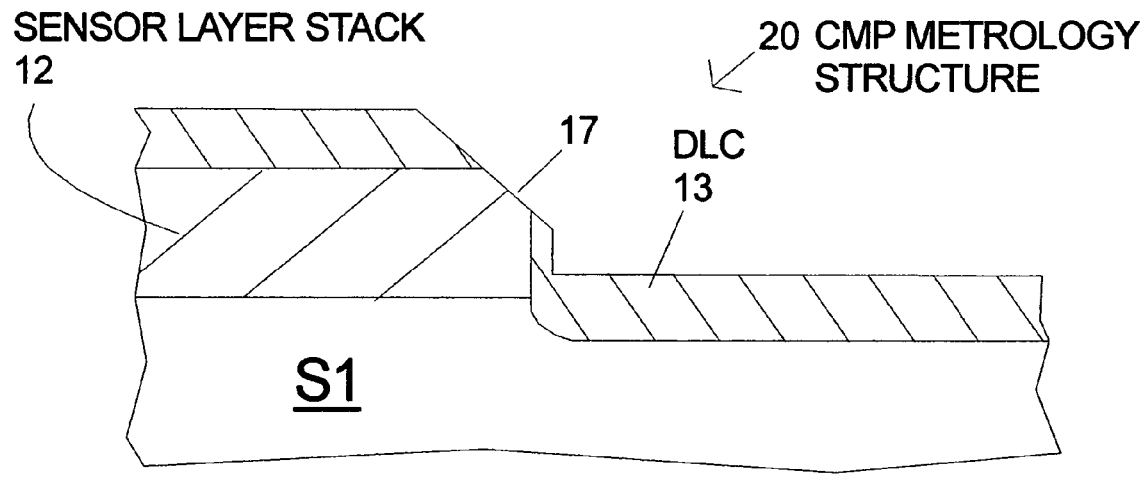
FIG. 3 illustrates a section of a CMP metrology test site according to the invention after some CMP has been performed. The section is taken perpendicular to the surface of the wafer.

FIG. 3 illustrates a section of a CMP metrology test site according to the invention after some CMP has been performed on the structure of FIG. 2. The CMP process has preferentially attacked the edge of the trench and has removed the DLC from the edge exposing a surface 17 of the sensor layer stack underneath. The DLC on both sides of the exposed edge remains in place. When viewed through an SEM there will be a sharp contrast between the surrounding DLC and the exposed metal 17.

The SEM uses a top-down view of the wafer. The exposed edge 17 can be made in any pattern of lines and corners as viewed from above the wafer. As the CMP progresses the lines made by the edge 17 will become wider. The shape and number of the trenches formed at the metrology test site are selected to produce a pattern that is easily measurable by a CD-SEM. In theory a single line might be used, but in practice a set of lines is preferred.

Figure 4:
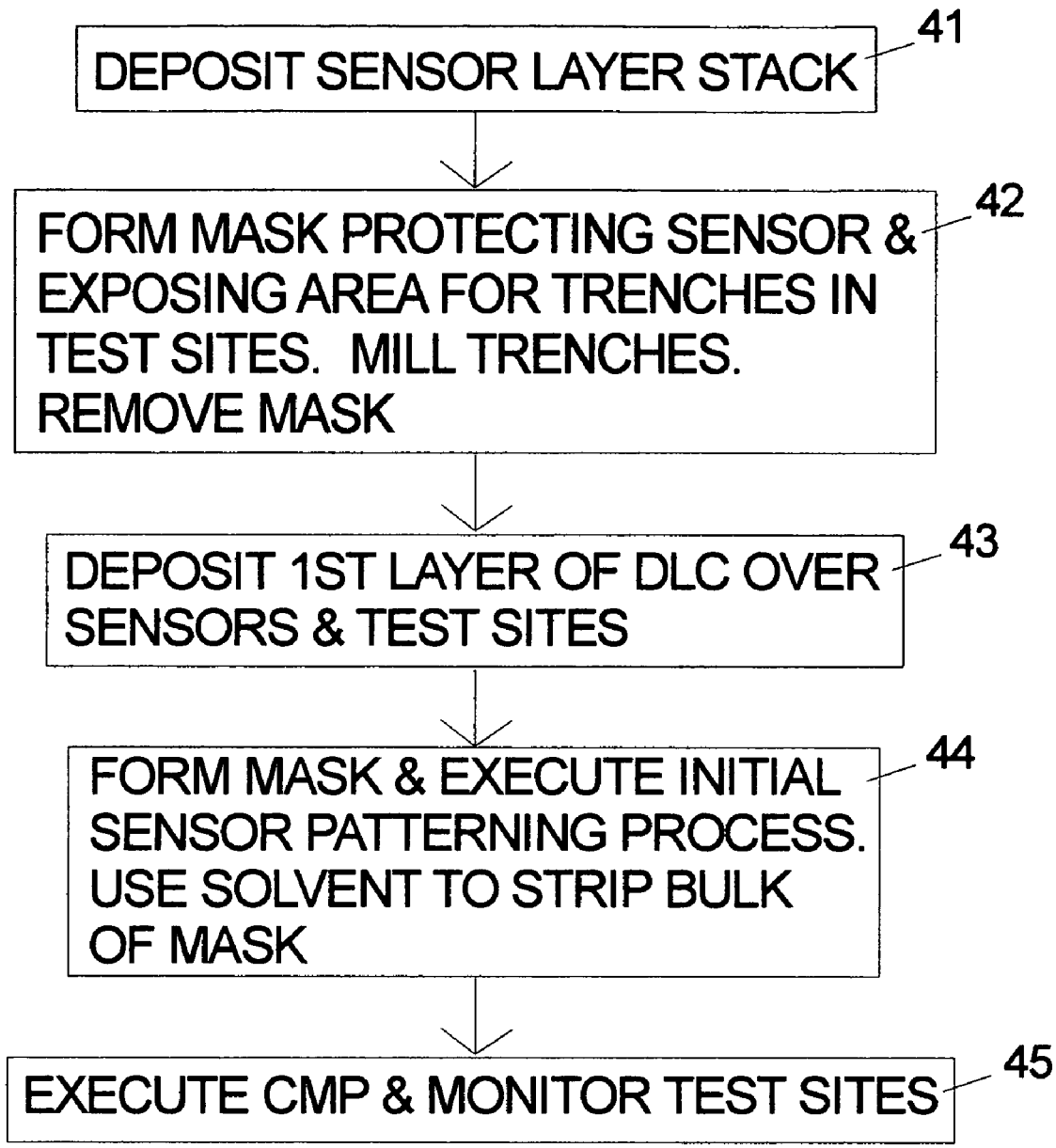
FIG. 4 is a flow chart of a method of making and using metrology test sites according to an embodiment of the invention.

FIG. 4 is a flowchart of an embodiment of a method according to the invention. The sensor layer stack is deposited over the wafer 41. A photoresist mask is patterned to protect the sensor areas while leaving the trenches for the test sites exposed 42. As noted above, this step can be combined as part of milling operation to expose alignment marks under the sensor layer stack. The trenches for the metrology test sites are milling and then the photoresist mask is stripped off of the wafer 42. The DLC layer which is deposited over the sensor layer stack as part of the prior art fabrication process is preferably also the covering layer of DLC for the test sites 43. The prior art process of fabricating the sensors is resumed at this point. The mask for the initial patterning of the sensor is deposited over the wafer including the metrology test sites. The alumina refill and the top layer of DLC are deposited over the mask on the test sites and then the bulk of the photoresist mask, including over the test sites, is removed using a solvent 44. As in the prior art a CMP process is executed at this point to remove the residual photoresist from the sensor areas. The metrology test sites are monitored to gauge the progress of the CMP 45. The width of the exposed edge of material in the metrology test sites can be measured using a CD-SEM at any number of selected points during the CMP.

The preferred embodiment invention describes the build-up and use of the of the test structure to monitor K3 CMP process for tunnel-junction magnetoresistive (TMR) sensors, but the invention can also be used for giant magnetoresistive sensors.

Although the embodiments of the invention have been described in particular embodiments those skilled in the art will recognize that the invention may be used in other embodiments where CMP is used.

The invention claimed is:

1. A method of fabricating thin film metrology test devices on a wafer comprising the steps of:
   depositing a base layer structure for a metrology test site;
   forming an edge in the base layer structure by removing a selected area of the base layer structure;
   depositing a covering material over the edge in the base layer structure;
   performing a chemical-mechanical polishing (CMP) on the wafer; and
   measuring a width of the base layer structure exposed through the covering material as a metric of CMP progress.

2. The method of claim 1 wherein the base layer structure includes a layer of metal and the covering material is carbon.

3. The method of claim 1 wherein the base layer structure is a layer stack for a magnetic sensor.

4. The method of claim 3 wherein the step of forming an edge in the base layer structure is performed as a part of a process of milling through the base layer structure to expose alignment marks under the base layer structure.

5. The method of claim 3 wherein the covering material is carbon which is deposited over the layer stack for a magnetic sensor.

6. A method of fabricating magnetic sensors on a wafer comprising the steps of:
   depositing a layer stack for a magnetic sensor on the wafer;
   patterning a first mask on the wafer including an opening for at least one test site;
   milling a trench in the layer stack for the magnetic sensor through the opening for the test site;
   removing the first mask;
   depositing a layer of nonmetallic material over the wafer including the test site;
   patterning a second mask on the wafer for performing a milling process to define an edge of the magnetic sensor, the second mask covering the test site;
   milling to define an edge of the magnetic sensor through the second mask;
   performing a chemical-mechanical polishing to remove the second mask; and
   measuring an edge of the layer stack at the test site exposed through the nonmetallic material to determine progress of the chemical-mechanical polishing.

7. The method of claim 6 wherein the nonmetallic material is carbon.

8. The method of claim 6 wherein the step of milling the trench is performed simultaneously with milling to expose alignment marks under the layer stack for the magnetic sensor.

* * * * *